(12) United States Patent
Zeng

(10) Patent No.: US 9,768,167 B2
(45) Date of Patent: Sep. 19, 2017

(54) METHOD AND DEVICE FOR A FINFET

(71) Applicant: SEMICONDUCTOR MANUFACTURING INTERNATIONAL (SHANGHAI) CORPORATION, Shanghai (CN)

(72) Inventor: Yizhi Zeng, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 14/962,315

(22) Filed: Dec. 8, 2015

(65) Prior Publication Data
US 2016/0204105 A1 Jul. 14, 2016

(30) Foreign Application Priority Data
Jan. 12, 2015 (CN) .......................... 2015 1 0014336

(51) Int. Cl.
| | | |
|---|---|---|
| H01L 21/02 | (2006.01) | |
| H01L 21/311 | (2006.01) | |
| H01L 21/8234 | (2006.01) | |
| H01L 29/161 | (2006.01) | |
| H01L 27/088 | (2006.01) | |
| H01L 21/8238 | (2006.01) | |
| H01L 27/092 | (2006.01) | |

(Continued)

(52) U.S. Cl.
CPC ...... *H01L 27/0886* (2013.01); *H01L 21/0228* (2013.01); *H01L 21/02271* (2013.01); *H01L 21/31116* (2013.01); *H01L 21/823431* (2013.01); *H01L 21/823807* (2013.01); *H01L 21/823821* (2013.01); *H01L 27/0924* (2013.01); *H01L 29/7848* (2013.01); *H01L 29/165* (2013.01)

(58) Field of Classification Search
None
See application file for complete search history.

(56) References Cited

U.S. PATENT DOCUMENTS

| | | | |
|---|---|---|---|
| 8,383,474 B2* | 2/2013 | Cheng | H01L 29/66772 438/199 |
| 2004/0075122 A1* | 4/2004 | Lin | H01L 29/42384 257/288 |

(Continued)

*Primary Examiner* — Johannes P Mondt
(74) *Attorney, Agent, or Firm* — Kilpatrick Townsend & Stockton LLP

(57) ABSTRACT

A method of forming a semiconductor device includes providing a semiconductor substrate. The semiconductor substrate includes a plurality of fins formed thereon, a stress layer formed on the top surface of each of the fins, and a plurality of strip-shaped gate structures formed above the stress layers. The method further includes forming a contact hole etch stop layer. The method further includes forming a first interlayer dielectric layer to fill the gaps between adjacent fins. The first interlayer dielectric layer includes filling voids formed therein. The method further includes back etching the first interlayer dielectric layer to cause the top surface of the first interlayer dielectric layer to be just above the filling voids. The method further includes forming a barrier liner layer over the first interlayer dielectric layer, and forming a second interlayer dielectric layer over the barrier liner layer and the contact hole etch stop layer.

10 Claims, 7 Drawing Sheets

(51) Int. Cl.
*H01L 29/78* (2006.01)
*H01L 29/165* (2006.01)

(56) References Cited

U.S. PATENT DOCUMENTS

| | | | |
|---|---|---|---|
| 2010/0065915 A1* | 3/2010 | Chuang | H01L 21/31053 257/369 |
| 2011/0151677 A1* | 6/2011 | Wang | H01L 21/02343 438/773 |
| 2013/0020708 A1* | 1/2013 | Purayath | H01L 21/76885 257/761 |
| 2014/0217517 A1* | 8/2014 | Cai | H01L 27/0886 257/401 |
| 2015/0108589 A1* | 4/2015 | Cheng | H01L 29/511 257/411 |
| 2015/0179503 A1* | 6/2015 | Tsai | H01L 21/76224 257/347 |

* cited by examiner

METHOD AND DEVICE FOR A FINFET

CROSS-REFERENCES TO RELATED APPLICATIONS

This application claims priority to Chinese patent application No. 201510014336.8, filed on Jan. 12, 2015, the content of which is incorporated herein by reference in its entirety.

BACKGROUND OF THE INVENTION

The present invention relates to semiconductor technologies, more particularly to a method of forming a semiconductor device.

With the continuing development of semiconductor technologies, the improvements in the performance of integrated circuits are mainly achieved through shrinking the size of the integrated circuit device and increasing its speed. Currently, because the pursuit of high-density, high performance and low cost in the semiconductor industry has progressed to nano-technology process node, especially when the semiconductor device dimensions have been reduced down to 20 nm or below, semiconductor device fabrication is constrained by a variety of physical limits. Reduced feature sizes cause reduction of the spatial dimensions of the device's structural characteristics. Gaps and groove widths in devices have been narrowed to such a degree that the depth-to-width aspect ratio is high enough to cause difficulty in dielectric gap filling.

In a FinFET process, flowable chemical vapor deposition (Flowable CVD, or FCVD) is usually used in forming an interlayer dielectric layer. In the source/drain region, the SiGe or SiC stress layers formed on the top surfaces of the fins have irregular shapes and their sizes fluctuate widely. The inventors have observed that this causes the gaps between adjacent fins to become narrower, which in turn affects the filling ability of the FCVD interlayer dielectric material, resulting in filling voids, as shown in FIG. 1. Thus, the density of the interlayer dielectric layer is reduced.

Therefore, there is a need for a better manufacturing method.

SUMMARY OF THE INVENTION

According to an embodiment, a method of forming a semiconductor device includes providing a semiconductor substrate. The semiconductor substrate includes a plurality of fins formed thereon, a stress layer formed on the top surface of each of the fins, and a plurality of strip-shaped gate structures formed above the stress layers. Each gate structure extends in a direction substantially perpendicular to the fins.

The method further includes forming a contact hole etch stop layer covering the surface of the semiconductor substrate, the sidewalls of the fins, and the top surfaces and sidewalls of the stress layers. The method further includes forming a first interlayer dielectric layer to fill the gaps between adjacent fins. The top surface of the first interlayer dielectric layer is above the top surfaces of the stress layers. The first interlayer dielectric layer includes filling voids formed therein. The method further includes back etching the first interlayer dielectric layer to cause the top surface of the first interlayer dielectric layer to be just above the filling voids. The method further includes forming a barrier liner layer over the exposed surface of the remaining first interlayer dielectric layer, and forming a second interlayer dielectric layer over the barrier liner layer and the contact hole etch stop layer.

According some embodiments, the materials for the stress layers include SiGe or SiC.

According to an embodiment, the method further includes, before forming the first interlayer dielectric layer, forming a high aspect ratio pad (HARP) layer over the contact hole etch stop layer. According to some embodiments, the HARP layer includes an oxide layer formed by chemical vapor deposition or atomic layer deposition. According to some embodiments, the method further includes, before forming the first interlayer dielectric layer, back etching the HARP layer using SiCoNi dry etching, or treating the first interlayer dielectric layer using ozone.

According to embodiments, the material for the barrier liner layer includes oxide or nitride. According to some embodiments, the barrier liner layer has a thickness ranging from about 2 nm to about 15 nm.

According to an embodiment, forming the first interlayer dielectric layer or the second interlayer dielectric layer includes depositing a flowable dielectric material, curing the flowable dielectric material, and annealing the flowable dielectric material. According to an embodiment, curing the flowable dielectric material is performed using deionized water and ozone. According to embodiments, annealing the flowable dielectric material includes vapor annealing or dry annealing, or a combination of the two.

According to another embodiment of the present invention, a semiconductor device includes: a semiconductor substrate, a plurality of fins formed on a front surface of the semiconductor substrate, a stress layer formed on the top surface of each fin, and a plurality of strip-shaped gate structures formed above the stress layers. Each gate structure extends in a direction substantially perpendicular to the direction of the fins. The semiconductor device further includes a contact hole etch stop layer covering the front surface of the semiconductor substrate, sidewalls of the fins, and top surfaces and sidewalls of the stress layers.

The semiconductor device further includes a first interlayer dielectric layer over the contact hole etch stop layer. The first interlayer dielectric layer includes filling voids formed therein. The top surface of the first interlayer dielectric layer is below the top surfaces of the stress layers. The semiconductor device further includes a barrier liner layer over the first interlayer dielectric layer, and a second interlayer dielectric layer over the barrier liner layer and the contact hole etch stop layer.

According to a specific embodiment of the present invention, an electronic apparatus is provided as described below in the third example. The electronic apparatus includes the semiconductor device described above.

In summary, according to an embodiment of the present invention, a first interlayer dielectric layer, a barrier liner layer, and a second dielectric layer form a stacked dielectric layer in a device. The barrier liner layer provides protection to the filling voids in the first interlayer dielectric layer, thereby preventing contamination of the device from the stress layers and improving the strength and density of the dielectric layer, as well as increasing the process window. In addition, the processing temperature of the entire process is low, which increases the gap filling capabilities of flowable dielectric materials, thereby improving the yield and performance of the device.

DETAILED DESCRIPTION OF THE INVENTION

Figure 1:
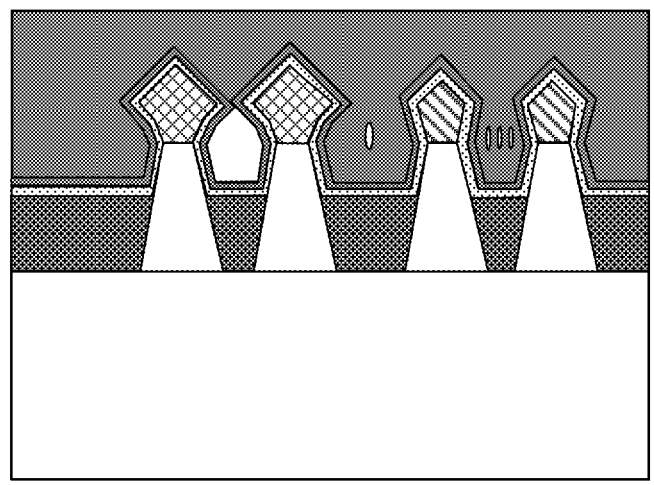
FIG. 1 illustrates a schematic cross-sectional view of a conventional semiconductor device.

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It should be understood that the drawings are not drawn to scale, and similar reference numbers are used for representing similar elements. Embodiments of the invention are described herein with reference to cross-section illustrations that are schematic illustrations of idealized embodiments (and intermediate structures) of the invention. The thickness of layers and regions in the drawings may be exaggerated relative to each other for clarity. Additionally, variations from the shapes of the illustrations as a result, for example, of manufacturing techniques and/or tolerances, are to be expected. Thus, embodiments of the invention should not be construed as limited to the particular shapes of regions illustrated herein, but are to include deviations in shapes that result, for example, from manufacturing.

It will be understood that, when an element or layer is referred to as "on," "disposed on," "adjacent to," "connected to," or "coupled to" another element or layer, it can be disposed directly on the other element or layer, adjacent to, connected or coupled to the other element or layer, or intervening elements or layers may also be present. In contrast, when an element is referred to as being "directly on," directly disposed on," "directly connected to," or "directly coupled to" another element or layer, there are no intervening elements or layers present between them. It will be understood that, although the terms "first," "second." "third," etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Relative terms such as "under," "below," "underneath," "over," "on," "above," "bottom," and "top" are used herein to described a relationship of one element, layer or region to another element, layer or region as illustrated in the figures. It will be understood that these terms are intended to encompass different orientations of the structure in addition to the orientation depicted in the figures. For example, if the device shown in the figures is flipped, the description of an element being "below" or "underneath" another element would then be oriented as "above" the other element. Therefore, the term "below," "under," or "underneath" can encompass both orientations of the device. Because devices or components of embodiments of the present invention can be positioned in a number of different orientations (e.g., rotated 90 degrees or at other orientations), the relative terms should be interpreted accordingly.

The terms "a", "an" and "the" may include singular and plural references. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, nents, and/or groups thereof. Furthermore, as used herein, the words "and/or" may refer to and encompass any possible combinations of one or more of the associated listed items.

The use of the terms first, second, etc., do not denote any order, but rather the terms first, second, etc., are used to distinguish one element from another. Furthermore, the use of the terms a, an, etc., does not denote a limitation of quantity, but rather denote the presence of at least one of the referenced items.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein, but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

The present invention will now be described more fully hereinafter with reference to the accompanying drawings, in which preferred embodiments of the invention are shown. This invention may, however, be embodied in many different forms and should not be construed as limited by the embodiments set forth herein. Rather, these embodiments are provided so that this disclosure will be thorough and complete, and will fully convey the scope of the invention to those skilled in the art.

First Embodiment

With reference to FIGS. 2A-2G and FIG. 3, detailed steps of a method according embodiments of the present invention are described.

Figure 2A:
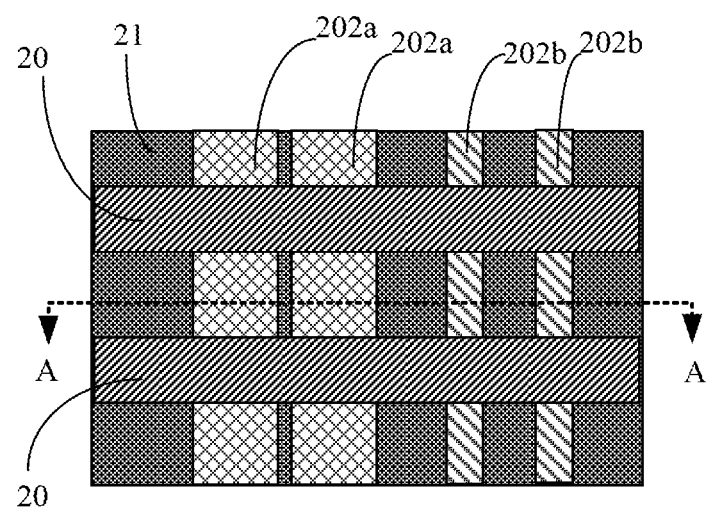
FIGS. 2A-2G illustrates schematic cross-sectional views of a semiconductor device in various steps of a manufacturing method according to embodiments of the invention.
Figure 2A:
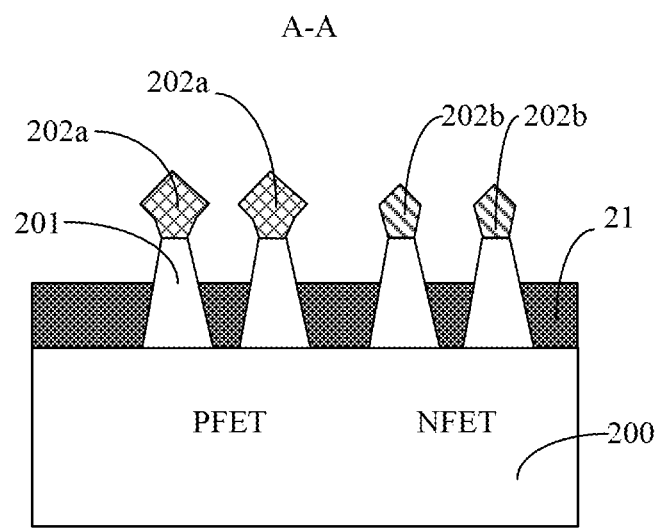

With reference to FIG. 2A, a semiconductor substrate 200 is provided. The semiconductor substrate 200 includes a plurality of fins 201 formed thereon, and stress layers 202*a* and 202*b* formed on the top surfaces of the fins 201. The semiconductor substrate 200 also includes a plurality of strip-shaped gate structures 20 above the plurality of fins 201. Each gate structure 20 extends in a direction perpendicular to the direction of the fins 201.

The semiconductor substrate 200 may include at least one of the following materials: silicon, silicon on insulator (SOI), stacked silicon-on-insulator (SSOI), stacked silicon germanium on insulator (S—SiGeOI), silicon-germanium-on-insulator (SiGeOI), and germanium-on-insulator (GeOI), and the like. In addition, the semiconductor substrate 200 may include defined source/drain regions.

A plurality of fins 201 is formed on the semiconductor substrate 200. As an example, a method of forming the fins 201 includes forming a hard mask layer on the semiconductor substrate 200, such as silicon nitride, and forming a patterned photoresist layer on the hard mask layer. The photoresist layer defines the fins 201. Etching is then performed on the hark mask layer and the semiconductor substrate using the photoresist layer as a mask, thereby forming the fins on the semiconductor substrate. The photoresist layer is removed afterward. The method of removing the photoresist layer may include oxidized ashing. It should be noted that the method of forming the fins 201 described herein are merely exemplary. One of ordinary skill in the art would recognize many variations, alternatives, and modifications.

Isolation structures 21, such as shallow trench isolation or local oxide layer, are formed on the semiconductor substrate 200. In one embodiment of the present invention, the isolation structures 21 include shallow trench isolations. The method for forming a shallow trench isolation may be selected from commonly used methods. For example, the method includes depositing an oxide layer on the semiconductor substrate 200, and etching back the oxide layer to form the shallow trench isolation whose top is below the fins 201.

The stress layers 202a and 202b are located on the top surfaces of the fins 201. For a PFET, the material for the stress layer 202a may include silicon germanium. For an NFET, the material for the stress layer 202b may include carbon silicon. According to embodiments, the stress layers 202a and 202b have irregular shapes whose dimensions fluctuate widely. As illustrated in the cross-sectional view along the AA direction shown in FIG. 2A, the large fluctuations in the size of the stress layers 202a and 202b results in the narrowing of the gaps between adjacent fins 201, which leads to difficulties in the subsequent interlayer dielectric layer filling.

A plurality of strip-shaped gate structures 20 extending in the direction substantially perpendicular to the direction of the fins 201 is formed above the stress layers 202a and 202b. As an example, the gate structures 20 include a gate dielectric layer and a gate material layer above it. The material for the gate dielectric layer may include an oxynitride layer, e.g., silicon oxynitride (SiON) layer, or a high-k dielectric layer. The high-k dielectric layer material may include hafnium oxide, hafnium silicon oxide, hafnium oxynitride silicon, lanthanum oxide, zirconium oxide, zirconium silicon oxide, titanium oxide, tantalum oxide, barium strontium titanium oxide, barium titanium oxide, strontium titanium oxide, alumina, and the like. According to embodiments, the high-k layer material includes preferably hafnium oxide, zirconium oxide, or aluminum oxide. The gate material layer may include one or more of a polysilicon layer, a metal layer, a conductive metal nitride layer, a conductive metal oxide layer, and a metal silicide layer. The metal layer may include tungsten (W), nickel (Ni), or titanium (Ti). The conductive metal nitride layer may include a titanium nitride (TiN) layer. The conductive metal oxide layer may include an iridium oxide ($IrO_2$) layer. The metal silicide layer may include a titanium silicide (TiSi) layer.

Figure 2B:
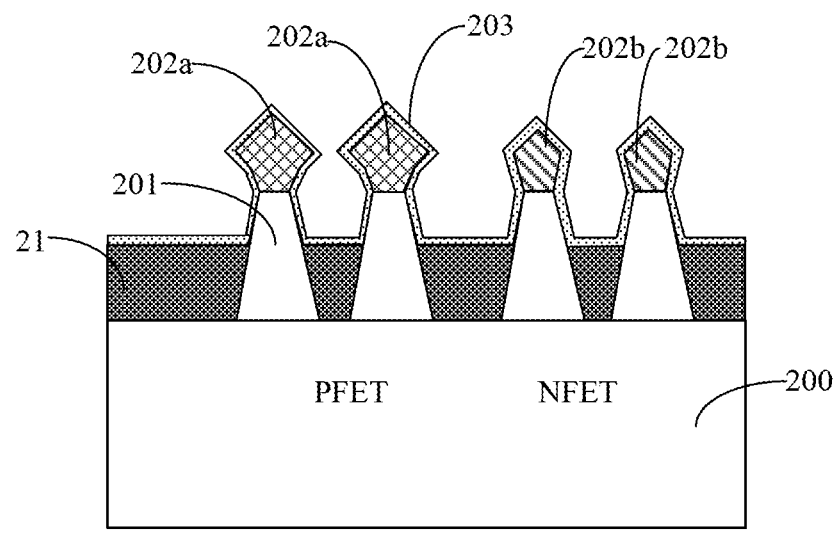

With reference to FIG. 2B, a contact hole etch stop layer (CESL) 203 is formed by deposition. The contact hole etch stop layer covers the surface of the semiconductor substrate 200, the sidewall of the fins 201, and the top surfaces and sidewalls of the stress layers 202a and 202b. According to embodiments, the material for the contact hole etch stop layer 203 may include silicon nitride or other suitable material. The method of forming the contact hole etch stop layer 203 may include, but is not limited to, physical vapor deposition, chemical vapor deposition, other suitable deposition process, or other nitridation processes.

Figure 2C:
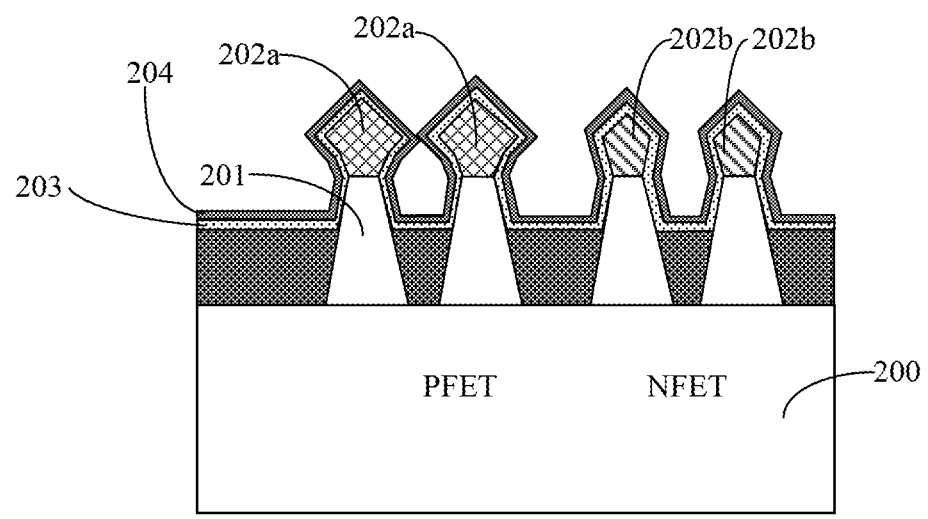

With reference to FIG. 2C, a high aspect ratio pad (HARP) layer 204 is formed over the contact hole etch stop layer 203. According to embodiments, the HARP layer 204 includes an oxide layer formed by chemical vapor deposition or atomic layer deposition. According to embodiments, the HARP layer 204 may be back etched using a SiCoNi dry etching process, or may be treated with ozone. In an embodiment, the HARP layer 204 is cleaned using a mixed solution (SC1 solution) of ammonia, hydrogen peroxide and deionized water, or using ozone gas or any other suitable gas or solution. Using oxygen-enriched gas or solution to clean the HARP layer 204 can increase the oxygen content in the HARP layer 204, for example, causing the silicon to be combined with oxygen. Thus, the HARP layer 204 may be transformed into an oxygen-rich pad layer that contains more active oxygen.

Figure 2D:
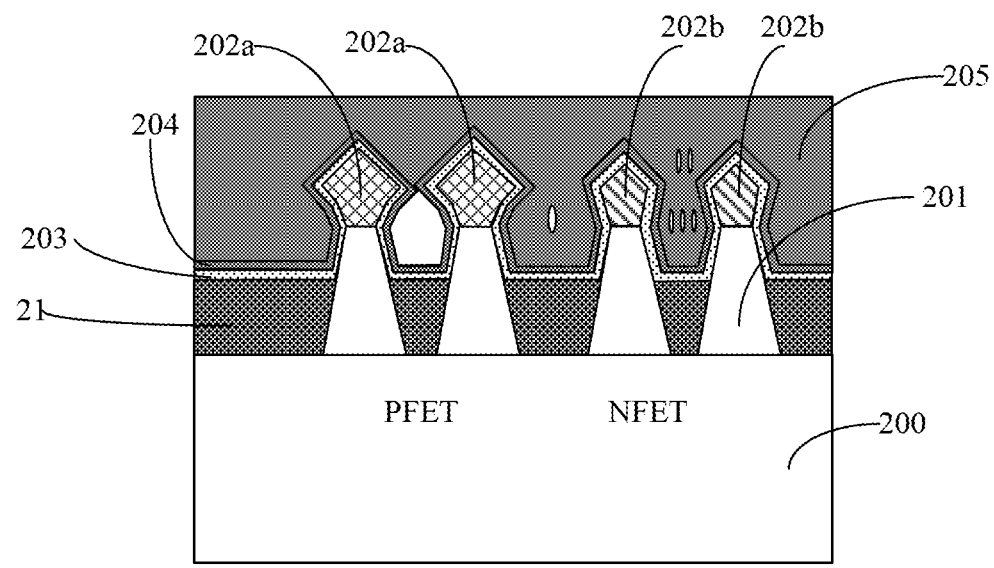

With reference to FIG. 2D, a first interlayer dielectric layer 205 is formed to fill the gaps between adjacent fins 201. The top of the first interlayer dielectric layer 205 is higher than the top surfaces of the stress layers 202a and 202b. The first interlayer dielectric layer 205 includes filling voids formed therein. The material for the first interlayer dielectric layer 205 may include flowable silicon dioxide or silicon oxynitride.

According to an embodiment, the method of forming the first interlayer dielectric layer 205 includes depositing a flowable dielectric material, curing the flowable dielectric material, and annealing the flowable dielectric material. According to embodiments, the flowable dielectric material may be formed by using spin-on-dielectrics (SOD), such as silicates, siloxanes, methyl silsesquioxane (methyl Silses-Quioxane, MSQ), hydrogen silsesquioxane (hydrogen Silse-Quioxane, HSQ), MSQ/HSQ, full hydrogen silazane (perhydrosilazane, TCPS), or all hydrogen polysilazane (perhydro-polysilazane, PSZ). According to other embodiments, the first interlayer dielectric layer 205 includes $SiO_2$. The method of forming the flowable dielectric material includes flowable chemical vapor deposition (FCVD), using silicon-containing precursor (e.g., organosilanes) and oxygen-containing precursor (e.g. oxygen, ozone or nitrogen oxides, etc.) reaction, to form a silicon oxide layer on the substrate. The silicon oxide layer formed by this method contains a high concentration of silicon-hydroxyl bonds (Si—OH), which increases the flowability of silicon oxide, causing it to move quickly into the gaps or trenches on the substrate.

Curing is then performed on the flowable dielectric material. In one embodiment, the curing treatment uses deionized water combined with $O_3$. The $O_3$ flow rate ranges from 100 to 5000 sccm. The curing temperature ranges from 10° C. to 500° C. The curing pressure ranges from 1 torr to 760 torr. It is believed that curing the flowable dielectric material causes the transformation of the Si—O bond network, thereby increasing the density of the first interlayer dielectric layer.

Annealing of the flowable dielectric material may include vapor annealing or dry annealing, or a combination of the two, or in combination with other annealing methods, such as plasma annealing, ultraviolet light annealing, electron beam annealing, and microwave annealing. Dry annealing atmosphere can be dry nitrogen, helium, or argon. According to embodiments, the annealing temperature ranges from 400° C. to 600° C., or other temperature that may improve the quality of the flowable dielectric material.

Due to the large fluctuation in the sizes of the stress layers 202a and 202b, which may result in the narrowing of the gaps between adjacent fins 201, the first interlayer dielectric layer 205 formed through the above steps may include filling voids. The filling voids affect the reliability and stability of the device.

Figure 2E:
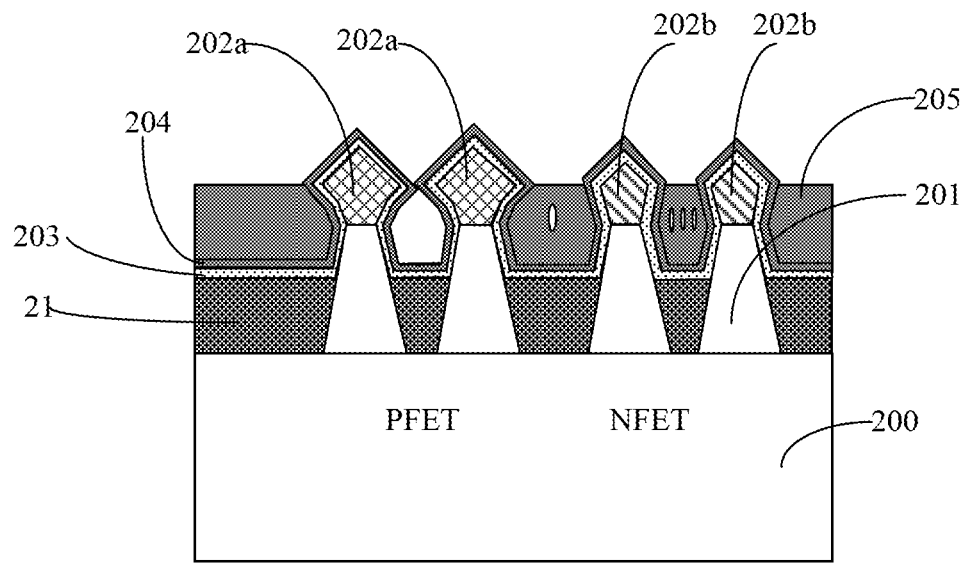

With reference to FIG. 2E, back etching is performed on the first interlayer dielectric layer 205 to cause the top surface of the first interlayer dielectric layer 205 to be just above the top of the filling voids. According to embodiments, the back etching method may include SiCoNi etching or dry etching. The back etching process has high etch selectivity between the first interlayer dielectric layer 205 and the contact hole etch stop layer 203. During a SiCoNi etch, one may use in-situ or ex-situ SiCoNi etching to remove the silicon oxide. In a specific embodiment of the present invention, dry etching may be employed to perform the back etching process. The dry etching process may include, but is not limited to, reactive ion etching (RIE), ion beam etching, plasma etching, or laser cutting. In a plasma etching, an oxygen-based gas may be used as the etching gas. The back etching process causes the top surface of the remaining first interlayer dielectric layer 205 to be below or flush with the top surface of the stress layers 202a and 202b.

Figure 2F:
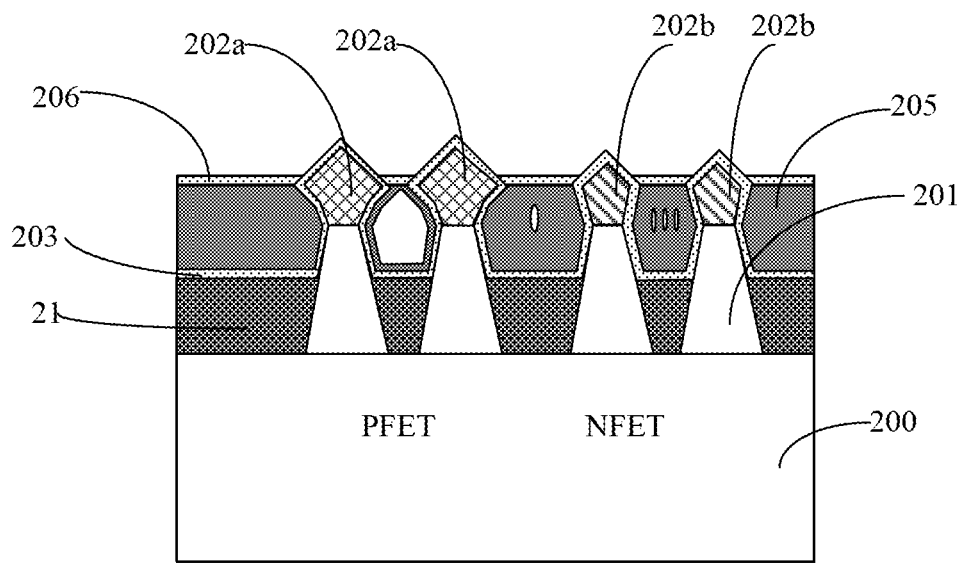

With reference to FIG. 2F, a barrier liner layer 206 is formed on the exposed surface of the remaining first interlayer dielectric layer 205. The material for the barrier liner layer 206 may include, but is not limited to, an oxide liner material or nitride liner material. In an embodiment, the barrier liner layer 206 includes an oxide liner material. Alternatively, the barrier liner layer 206 includes a nitride liner material such as silicon nitride. The method of forming the barrier liner layer 206 may include, but is not limited to, chemical vapor deposition or atomic layer deposition. In an embodiment, chemical vapor deposition is used to form an oxide liner layer. According to embodiments, the barrier liner layer 206 has a thickness ranging from 2 to 15 nm, for example 5 nm, 7 nm, or 10 nm, but is not limited to the above thickness and may be adjusted according to process capability. Because the barrier liner layer 206 has a higher density and higher strength, it provides protection to the filling voids formed in the first interlayer dielectric layer 205, thereby reducing the impact of the filling voids on device performance.

Figure 2G:
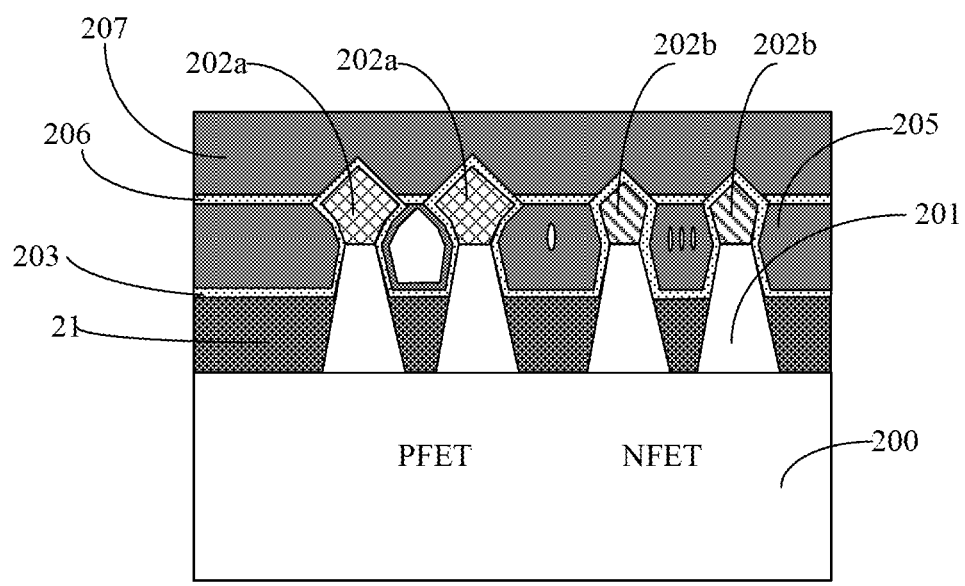

With reference to FIG. 2G, a second interlayer dielectric layer 207 is formed on the barrier liner layer 206. The material for the second interlayer dielectric layer 207 may include flowable silicon dioxide or flowable silicon oxynitride. The second interlayer dielectric layer 207 may be formed using processes similar to those used in forming the first interlayer dielectric layer 205 described above. According to an embodiment, the top surface of the second interlayer dielectric layer 207 is higher than the top surfaces of the stress layers 202a and 202b.

The method of forming a semiconductor device described above may be applied to various gap filling processes using flowable dielectric materials, especially dielectric materials that tend to form filling voids. For example, it may be applied to the formation of an interlayer dielectric layer in any technology node (e.g., 45 nm and below) in a high-k last metal gate process or a fin field-effect transistor (FinFET) fabrication process.

In summary, according an embodiment of the present invention, the first interlayer dielectric layer, the barrier liner layer, and the second dielectric layer form a stacked dielectric layer in a device. The barrier liner layer provides protection to the filling voids in the first interlayer dielectric layer, which prevents contamination of the device from the stress layers, improves the strength and density of the dielectric layer, while increasing the process window. In addition, the processing temperature of the entire process is low, which increases the gap filling capabilities of flowable dielectric materials, thus improving the yield and performance of the device.

Figure 3:
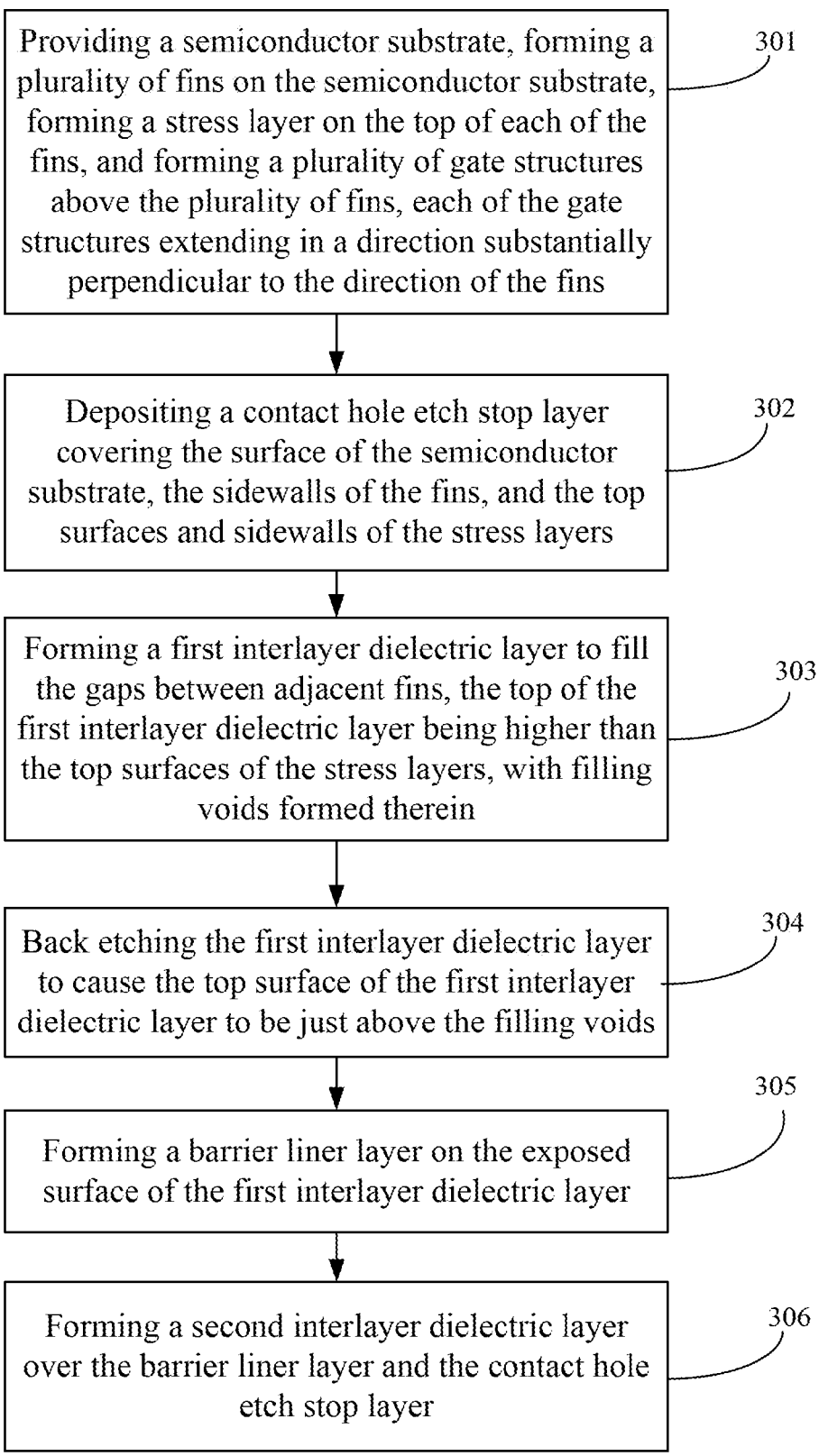
FIG. 3 shows a simplified flowchart illustrating a method of forming a semiconductor device according an embodiment of the invention.

FIG. 3 illustrates a simplified flowchart showing a process sequence according to an embodiment of the present invention. At step 301, a semiconductor substrate is provided. In addition, a plurality of fins is formed on the semiconductor substrate; a stress layer is formed on the top surface of each of the fins, and a plurality of strip-shaped gate structures is formed above the plurality of fins. Each gate structure extends in a direction substantially perpendicular to the direction of the fins. At step 302, a contact hole etch stop layer is formed by deposition. The contact hole etch stop layer covers the surface of the semiconductor substrate, the sidewalls of the fins, and the top surfaces and sidewalls of the stress layers.

At step 303, a first interlayer dielectric layer if formed. The first interlayer dielectric layer fills the gaps between adjacent fins. The top of the first interlayer dielectric layer is higher than the top surfaces of the stress layers. The first interlayer dielectric layer includes filling voids formed therein. At step 304, back etching is performed on the first interlayer dielectric layer to cause the top surface of the remaining first interlayer dielectric layer to be just above the filling voids. At step 305, a barrier liner layer is formed on the exposed surface of the first interlayer dielectric layer. At step 306, a second interlayer dielectric layer is formed over the barrier liner layer and the contact hole etch stop layer.

Second Embodiment

Figure 4:
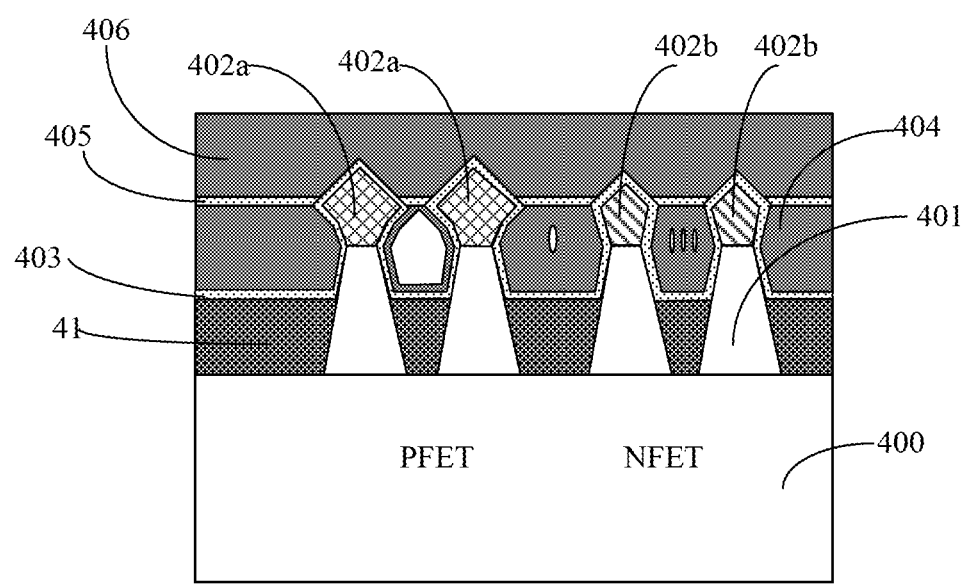
FIG. 4 illustrates a schematic cross-sectional view of a semiconductor device according to an embodiment of the invention.

Referring to FIG. 4, a semiconductor device formed by the method described in the first example is provided. The semiconductor device includes a semiconductor substrate 400. The material for the semiconductor substrate 400 may include at least one of the following: silicon, silicon on insulator (SOI), stacked silicon-on-insulator (SSOI), stacked silicon germanium-on-insulator (S—SiGeOI), silicon germanium-on-insulator (SiGeOI), germanium-on-insulator (GeOI), and the like. In addition, active regions may be defined on the semiconductor substrate. Isolation structures 41 are formed on the semiconductor substrate 400. The isolation structures 41 may include, for example, shallow trench isolation or local oxide layers. According to an embodiment, the isolation structures 41 include shallow trench isolation structures.

A plurality of fins 401 are formed on the semiconductor substrate 400. Stress layers 402a and 402b are formed on the top surfaces of the plurality of fins 401. For a PFET, the material for the stress layer 402a may include silicon-germanium; for an NFET, the material for the stress layer 402b may include carbon silicon. According to some embodiments, the stress layers 402a and 402b have irregular shapes and their sizes fluctuate widely.

A plurality of strip-shaped gate structures are formed above the stress layers 402a and 402b. Each gate structure extends in a direction substantially perpendicular to the direction of the fins 401. As an example, each gate structure includes a gate dielectric layer and a gate material layer stacked above it.

A contact hole etch stop layer (CESL) 403 is formed covering the surface of the semiconductor substrate 400, the sidewalls of the fins 401, and the top surfaces of the stress layers 402a and 402b. The material for the contact hole etch stop layer 403 may include silicon nitride or other suitable material. The contact hole etch stop layer 403 may be formed by, for example, physical vapor deposition, chemical vapor deposition, or other suitable deposition processes, or other nitridation processes.

A first interlayer dielectric layer 404 is formed above the contact hole etch stop layer 403. Filling voids are formed in the first interlayer dielectric layer 404. The material for the first interlayer dielectric layer 404 may include silicon dioxide or silicon oxynitride flow. In one embodiment, the method of forming the first interlayer dielectric layer 404 includes flow-type chemical vapor deposition (Flowable CVD, or FCVD). The top surface of the first interlayer dielectric layer 404 is lower than or flush with the top surfaces of the stress layers 402a and 402b.

According to an embodiment, a high aspect ratio pad (HARP) layer (not shown) is formed between the first interlayer dielectric layer 404 and the contact hole etch stop layer 403.

A barrier liner layer 405 is formed on the top surface of the first interlayer dielectric layer 404. The material for the barrier liner layer 405 may include, but is not limited to, oxide liner materials or nitride liner materials. In an embodiment, the material for the barrier liner layer 405 includes an oxide liner material. Alternatively, the barrier liner layer 405 includes a nitride such as silicon nitride. According to some embodiments, the thickness of the barrier liner layer 405 ranges from 2 to 15 nm, for example, 5 nm, 7 nm, or 10 nm. Other thickness values may be used, and may be adjusted according to process capabilities. Since the barrier liner layer 405 has a higher density and strength, it can provide protection to the filling voids formed in the first interlayer dielectric layer 404, thereby reducing the impact of the filling voids on device performance.

A second interlayer dielectric layer 406 is formed on the barrier liner layer 405 and the contact hole etch stop layer 403. According to an embodiment, the top surface of the second interlayer dielectric layer 406 is higher than the top surfaces of the stress layers 402a and 402b. The material for the second interlayer dielectric layer 406 may include silicon dioxide or silicon oxynitride flow. According to an embodiment, the materials for the second interlayer dielectric layer 406 and the first interlayer dielectric layer 404 are the same.

In summary, the semiconductor device according to an embodiment of the present invention includes the first interlayer dielectric layer, the barrier liner layer, and the second interlayer dielectric layer, which form a stacked dielectric layer of the device. The barrier liner layer protects the filling voids formed in the first interlayer dielectric layer, thus preventing contamination from the stress layers and improving the strength and density of the dielectric layer, thereby achieving excellent device performance.

Third Embodiment

According to an embodiment, an electronic apparatus is provided. The electronic apparatus includes the semiconductor device described in the second example, or the semiconductor device formed using the manufacturing method described in the first example.

The electronic apparatus may be a mobile phone, tablet PCs, laptops, netbooks, game consoles, TV receiver, VCD player, DVD player, GPS, camera, video camera, voice recorder, MP3, MP4, PSP players, or any other electronic products or equipment. It can also be an intermediate product having the above semiconductor device, for example: a mobile phone motherboard and the like.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments, as well as other embodiments, will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof.

What is claimed is:

1. A method of forming a semiconductor device, the method comprising:
   providing a semiconductor substrate, the semiconductor substrate including a plurality of fins formed thereon, each of the fins having a stress layer formed on a top surface thereof, and a plurality of strip-shaped gate structures formed above the stress layer of each of the fins, each gate structure extending in a direction substantially perpendicular to a direction of the fins;
   forming a contact hole etch stop layer covering a surface of the semiconductor substrate, sidewalls of the fins, and a top surface and sidewalls of the stress layer of each of the fins;
   forming a first interlayer dielectric layer filling gaps between adjacent fins, a top surface of the first interlayer dielectric layer being above the top surface of the stress layer of each of the fins, the first interlayer dielectric layer including filling voids formed therein;
   back etching the first interlayer dielectric layer causing a top surface of a remaining first interlayer dielectric layer to be below the top surface of the stress layer of each of the fins but above the filling voids;
   forming a barrier liner layer on the top surface of the remaining first interlayer dielectric layer; and
   forming a second interlayer dielectric layer on the barrier liner layer and the contact hole etch stop layer.

2. The method of claim 1, wherein the stress layer comprises SiGe or SiC.

3. The method of claim 1, further comprising, before forming the first interlayer dielectric layer, forming a high aspect ratio pad (HARP) layer over the contact hole etch stop layer.

4. The method of claim 3, wherein the HARP layer comprises an oxide layer formed by chemical vapor deposition or atomic layer deposition.

5. The method of claim 3, further comprising, before forming the first interlayer dielectric layer, back etching the HARP layer using SiCoNi dry etching, or treating the first interlayer dielectric layer using ozone.

6. The method of claim 1, wherein the barrier liner layer comprises oxide or nitride.

7. The method of claim 1, wherein the barrier liner layer has a thickness ranging from about 2 nm to about 15 nm.

8. The method of claim 1, wherein forming the first interlayer dielectric layer or the second interlayer dielectric layer comprises:
   depositing a flowable dielectric material;
   curing the flowable dielectric material; and
   annealing the flowable dielectric material.

9. The method of claim 8, wherein the curing is performed using deionized water and ozone.

10. The method of claim 8, wherein the annealing comprises vapor annealing or dry annealing, or a combination thereof.

* * * * *